United States Patent
Zhao

(10) Patent No.: US 9,568,573 B2
(45) Date of Patent: Feb. 14, 2017

(54) METHODS AND SYSTEMS FOR AUTOMATED MAGNETIC FIELD SHIMMING

(71) Applicant: Siemens Medical Solutions USA, Inc., Malvern, PA (US)

(72) Inventor: Tiejun Zhao, Pittsburgh, PA (US)

(73) Assignee: Siemens Healthcare GmbH, Erlangen (DE)

( * ) Notice: Subject to any disclaimer, the term of this patent is extended or adjusted under 35 U.S.C. 154(b) by 533 days.

(21) Appl. No.: 14/215,420

(22) Filed: Mar. 17, 2014

(65) Prior Publication Data

US 2015/0260810 A1    Sep. 17, 2015

(51) Int. Cl.
*G01R 33/483* (2006.01)
*G01R 33/24* (2006.01)
*G01R 33/385* (2006.01)
*G01R 33/34* (2006.01)
*G01R 33/3875* (2006.01)

(52) U.S. Cl.
CPC ......... *G01R 33/3875* (2013.01); *G01R 33/243* (2013.01); *G01R 33/34* (2013.01); *G01R 33/385* (2013.01); *G01R 33/4835* (2013.01)

(58) Field of Classification Search
CPC ..... G01R 33/243; G01R 33/34; G01R 33/385; G01R 33/4835; G01R 33/3875
See application file for complete search history.

(56) References Cited

U.S. PATENT DOCUMENTS

| | | | | |
|---|---|---|---|---|
| 5,587,658 A * | 12/1996 | Sukumar | ............ | G01R 33/3875 324/307 |
| 7,215,123 B2 * | 5/2007 | Axel | .................. | G01R 33/3875 324/318 |
| 8,963,547 B2 * | 2/2015 | Tsujita | ............... | G01R 33/3875 324/322 |

* cited by examiner

*Primary Examiner* — Gregory H Curran

(57) ABSTRACT

A method for automated magnetic field shimming in a MR imaging system includes generating RF excitation pulses in anatomy, generating slice select magnetic field gradients on a static magnetic field and generating a plurality of shimming routines. The method also includes acquiring maps of the static magnetic field between each shimming routine and determining a base function for each of the plurality of shimming coils from: (i) intermediate magnitudes and directions of the static magnetic field produced by each of the plurality of shimming coils during each shimming routine; and (ii) intermediate currents supplied to each of the plurality of shimming coils during each shimming routine. The method further includes determining updated magnitudes and directions of the static magnetic field produced by each of the plurality of shimming coils by expanding the determined base function for each of the plurality of shimming coils into low order polynomials.

20 Claims, 3 Drawing Sheets

METHODS AND SYSTEMS FOR AUTOMATED MAGNETIC FIELD SHIMMING

TECHNOLOGY FIELD

The present application relates generally to methods, systems, and apparatuses for magnetic field shimming in Magnetic Resonance (MR) imaging, and in particular, to methods, systems, and apparatuses for automated magnetic field shimming in MR imaging.

BACKGROUND

MR imaging is a medical imaging technique that uses an applied static magnetic field ($B_0$) and radio frequency (RF) pulses to make images (e.g., via slices) of organs and structures inside the body. During MR imaging, the magnetic field causes magnetic field vectors of protons (typically in hydrogen atoms) to align with the magnetic field. The RF pulses cause the magnetic field vectors of the protons to be displaced (e.g., rotate) relative to the magnetic field and re-align with the magnetic field. A MR imaging scanner picks up signals from the protons in the body that result from magnetization field vectors re-aligning with the magnetic field. The signals may then be converted into images based on the location and strength of the incoming signals.

The magnetic field includes a number of locations in space, with each location having a corresponding magnitude and direction. Homogeneity or uniformity of the magnetic field refers to similarity of the magnitude and the direction of each location (e.g., three dimensional volume) of the magnetic field in space. A completely homogenous or uniform magnetic field has the same magnitude and the same direction for each location in space. The quality of MR imaging depends on the homogeneity of the magnetic field. The non-homogeneity of the main static magnetic field ($B_0$) generated by an MR imaging system may lead to numerous imaging artifacts (e.g., banding artifacts) in MR imaging, such as steady-state free precession (SSFP) imaging.

SUMMARY

Embodiments of the present invention provide a method for automated magnetic field shimming in a Magnetic Resonance (MR) imaging system. The method includes generating radio frequency (RF) excitation pulses in a volume of patient anatomy that includes a patient's heart to provide subsequent acquisition of associated RF echo data. The method also includes generating slice select magnetic field gradients on a static magnetic field for phase encoding and readout RF data acquisition in the volume of patient anatomy and generating a plurality of shimming routines, each shimming routine comprising applying non-linear magnetic field gradients to the static magnetic field to modify the homogeneity of the static magnetic field. The method further includes acquiring a plurality of maps of the static magnetic field, each of the plurality of maps being acquired between each shimming routine and determining, by a control processor, a base function for each of the plurality of shimming coils from: (i) intermediate magnitudes and directions of the static magnetic field produced by each of the plurality of shimming coils during each shimming routine; and (ii) intermediate currents supplied to each of the plurality of shimming coils during each shimming routine. The method further includes determining, by the control processor, updated magnitudes and directions of the static magnetic field produced by each of the plurality of shimming coils by expanding the determined base function for each of the plurality of shimming coils into low order polynomials.

According to an embodiment, the method further includes determining the base function for each of the plurality of shimming coils by using data from a plurality of data sets, each data set provided by a corresponding shimming routine and comprising: (i) a change in the intermediate currents supplied to each of the plurality of shimming coils between each shimming routine; and (ii) a change in the intermediate magnitudes and directions of the static magnetic field between each shimming routine.

According to another embodiment, the method further includes storing: (i) the change in current supplied to each of the plurality of shimming coils between each shimming routine; and (ii) the change in the magnitude and direction of the static magnetic field between each shimming routine.

In one embodiment, the method further includes using the data from the plurality of data sets to determine the updated magnitudes and directions of the static magnetic field produced by each of the plurality of shimming coils when a number of shimming routines has been performed to cause the static magnetic field to be within a homogeneous threshold.

In another embodiment, the degree of the low order polynomials is in the range from about 6 degrees to about 10 degrees.

According to one embodiment, the method further includes determining the updated magnitudes and directions of the static magnetic field produced by each of the plurality of shimming coils by expanding the base function for each of the plurality of shimming coils into low order Legendre polynomials.

According to another embodiment, the method further includes replacing an original base function for one or more of the plurality of shimming coils with the determined base function for the one or more of the plurality of shimming coils when the determined base function is equal to or within a predetermined base function threshold of the original base function.

In yet another embodiment, the method further includes providing an indication that one or more of the plurality of shimming coils is degraded when the determined base function is not within a predetermined base function threshold of the original base function.

Embodiments of the present invention provide a multi-slice, multi-segment magnetic resonance (MR) imaging system that includes a radio frequency (RF) signal generator configured to generate RF excitation pulses in patient anatomy and enabling subsequent acquisition of associated RF echo data and a magnetic field gradient generator. The generator includes: (i) a plurality of gradient coils configured to generate linear slice select magnetic field gradients on a static magnetic field; and (ii) a plurality of shimming coils configured to generate a plurality of shimming routines, each shimming routine comprising applying non-linear magnetic field gradients to the static magnetic field to modify the homogeneity of the static magnetic field. The system also includes a plurality of RF coils configured to acquire a plurality of maps of the static magnetic field, each of the plurality of maps being acquired between each shimming routine. The system further includes a controller configured to determine: (i) a base function for each of the plurality of shimming coils from intermediate magnitudes and directions of the static magnetic field produced by each of the plurality of shimming coils during each shimming routine and intermediate currents supplied to each of the plurality of shimming coils during each shimming routine; and (ii) updated magnitudes and directions of the static magnetic field produced by each of the plurality of shimming coils by expanding the determined base function for each of the plurality of shimming coils into low order polynomials.

According to one embodiment, the controller is further configured to determine the base function for each of the plurality of shimming coils by using data from a plurality of data sets. Each data set is provided by a corresponding shimming routine and includes: (i) a change in current supplied to each of the plurality of shimming coils between each shimming routine; and (ii) a change in the magnitude and direction of the static magnetic field between each shimming routine.

According to one embodiment, the controller is further configured to store: (i) the change in current supplied to each of the plurality of shimming coils between each shimming routine; and (ii) the change in the magnitude and direction of the static magnetic field between each shimming routine.

In one embodiment, the controller is further configured to use the data from the plurality of data sets to determine the updated magnitudes and directions of the static magnetic field produced by each of the plurality of shimming coils when a number of shimming routines has been performed to cause the static magnetic field to be within a homogeneous threshold.

In another embodiment, the degree of the low order polynomials is in the range from about 6 degrees to about 10 degrees.

According to one embodiment, the controller is further configured to determine the updated magnitudes and directions of the static magnetic field produced by each of the plurality of shimming coils by expanding the base function for each of the plurality of shimming coils into low order Legendre polynomials.

According to one embodiment, the controller is further configured to replace an original base function for one or more of the plurality of shimming coils with the determined base function for the one or more of the plurality of shimming coils when the determined base function is equal to or within a predetermined base function threshold of the original base function.

In yet another embodiment, the controller is further configured to provide an indication that one or more of the plurality of shimming coils is degraded when the determined base function is not within a predetermined base function threshold of the original base function.

Embodiments of the present invention, an article of manufacture for operating a multi-slice, multi-segment magnetic resonance (MR) imaging system, the article of manufacture comprising a non-transitory, tangible computer-readable medium holding computer-executable instructions for performing a method that includes generating radio frequency (RF) excitation pulses in a volume of patient anatomy having a patient's heart to provide subsequent acquisition of associated RF echo data and generating slice select magnetic field gradients on a static magnetic field for phase encoding and readout RF data acquisition in the volume of patient anatomy. The method further includes performing generating a plurality of shimming routines. Each shimming routine includes applying non-linear magnetic field gradients to the static magnetic field to modify the homogeneity of the static magnetic field. The method also includes acquiring a plurality of maps of the static magnetic field. Each of the plurality of maps is acquired between each shimming routine. The method also includes determining a base function for each of the plurality of shimming coils from: (i) intermediate magnitudes and directions of the static magnetic field produced by each of the plurality of shimming coils during each shimming routine; and (ii) intermediate currents supplied to each of the plurality of shimming coils during each shimming routine. The method further includes determining updated magnitudes and directions of the static magnetic field produced by each of the plurality of shimming coils by expanding the determined base function for each of the plurality of shimming coils into low order polynomials.

In one embodiment, the medium holds computer-executable instructions for further performing determining the base function for each of the plurality of shimming coils by using data from a plurality of data sets, each data set provided by a corresponding shimming routine and comprising: (i) a change in current supplied to each of the plurality of shimming coils between each shimming routine; and (ii) a change in the magnitude and direction of the static magnetic field between each shimming routine.

In another embodiment, the medium holds computer-executable instructions for further performing using the data from the plurality of data sets to determine the updated magnitudes and directions of the static magnetic field produced by each of the plurality of shimming coils when a number of shimming routines has been performed to cause the static magnetic field to be within a homogeneous threshold.

In yet another embodiment, the medium holds computer-executable instructions for further performing replacing an original base function for one or more of the plurality of shimming coils with the determined base function for the one or more of the plurality of shimming coils when the determined base function is equal to or within a predetermined base function threshold of the original base function.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF EXEMPLARY EMBODIMENTS

Figure 1:
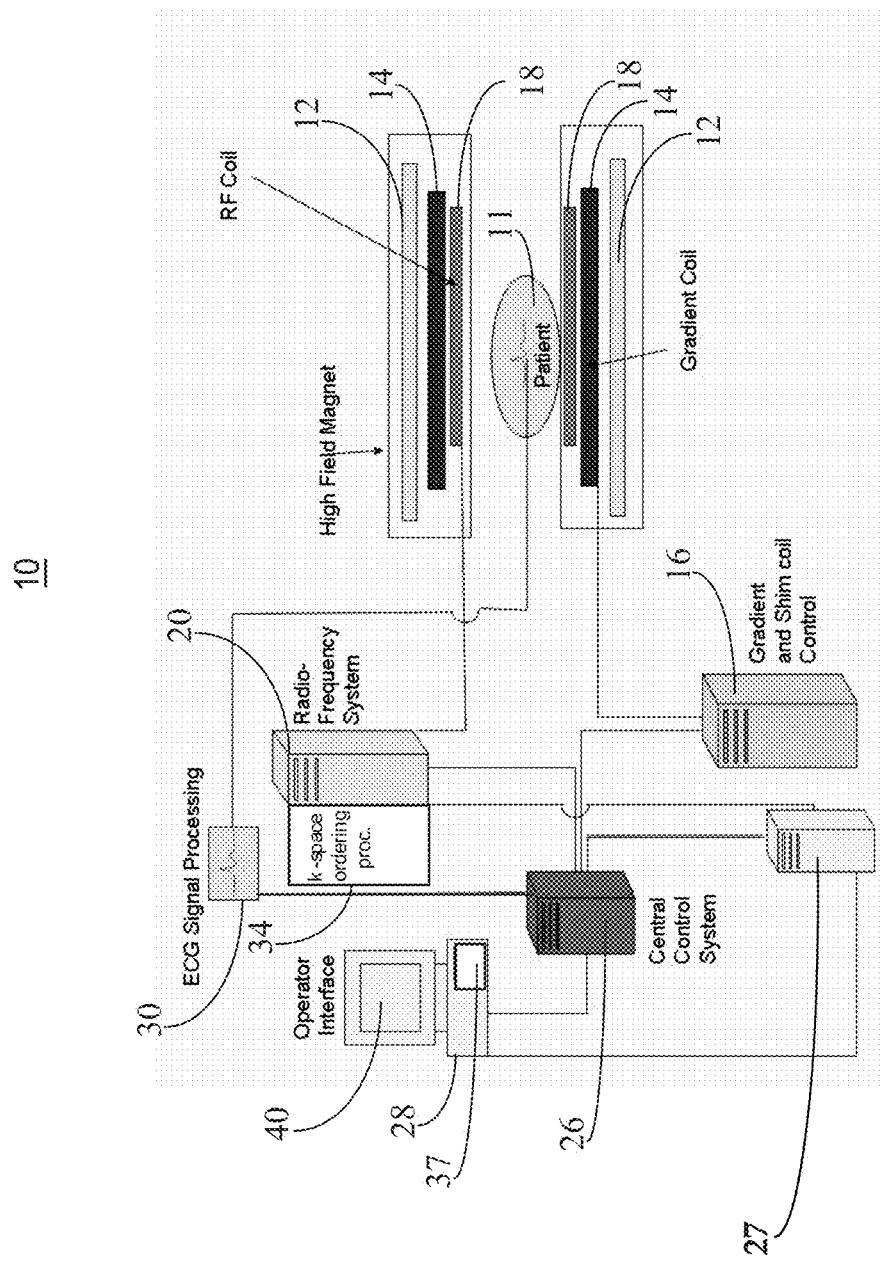
FIG. 1 is a system block diagram illustrating a system for automated magnetic field shimming in a Magnetic Resonance (MR) imaging system, for use with embodiments disclosed herein.

Some conventional MR imaging methods integrate additional shimming coils in the MR imaging system to optimize the homogeneity of $B_0$. Typically, the shimming coils represent additional fields up to the second order to minimize the $B_0$ variations introduced by individual patients or imaging objects. These conventional shimming methods typically include using a $B_0$ mapping sequence to obtain a $B_0$ map in three dimensions. The $B_0$ map is expressed as a linear combination of the field produced by each shimming coil. The corresponding coefficients are derived from a least square fitting method and are mapped as currents to the shim coils to compensate for the non-homogeneity measured by the $B_0$ map.

For example, the second order shim coils of conventional shimming methods produce three linear gradients (x, y and z) and 5 high-order shims (xy, zx, zy, $x^2-y^2$ and $z^2$) when expressed as the Legendre polynomials in the Cartesian coordinates. The measured $B_0$ (x, y, z) may then be posed as a least square problem as shown below in Equation (1):

$$B_0(x,y,z)=a_1x+a_2y+a_3z+a_4xy+a_5zx+a_6zy+a_7(x^2-y^2)+a_8z^2 \quad (1),$$

Where i=1, 2, . . . 8, are the fitting coefficients that directly determine the amount of electric currents to be supplied to a corresponding shimming coil. The linear and second order of the reference field map can also be expressed in the spherical polar form. The available shim coils are not, however, able to produce a desirable shimming field. For example, a $Z^2$ shimming coil typically produces $Z^2$ spatial $B_0$ variation with some contaminations of other terms, including both lower order terms and higher order terms. An intended $Z^2$ shimming coil may also contain some small components of $Z^4$ and $Z^6$ spatial variations for the produced $B_0$ field from this shim coil. To compensate, each reference $B_0$ field produced by a given physical shimming coil may be modeled as a linear combination of all terms with given coefficients up to a certain degree (e.g., up to $8^{th}$ order Legendre polynomials). That is, the measured $B_0$ field can be modeled as shown below in Equation (2):

$$B_0(x,y,z)=\Sigma_{i=1}^N a_i F_i(x,y,z) \quad (2),$$

Where $F_i$ is the base function for the shim fit and may be expressed as the linear summation of a chosen polynomial that to model the $B_0$ reference field produced by a physical shimming coil and N is the number of shim coils in the system.

Conventional systems and methods are, however, typically only able to model each reference $B_0$ field a single time, assuming that the reference $B_0$ field produced by a given shimming coil is the same for all MR imaging systems and the same model of shimming coil is used by that system. While iterative shimming methods may improve the final shimming results, too many iteration steps may lead to even worse $B_0$ fields if the base function is not modeled accurately. Inaccurate base modeling is typically caused by: (i) incomplete modeling of the reference field of each individual shim during the initial calibration stage; or (ii) each shim coil is incorrectly assumed to be identical. Each shim coil, including the same types of shim coils, may not be assumed to be the same for different reasons (e.g., due to manufacture accuracy).

A more accurate base function for shimming may be achieved by mapping the $B_0$ fields for each given shim coil of an MR imaging scanner. Mapping the $B_0$ fields for each shim coil, however, includes shim calibrations to provide $B_0$ maps that are accurate enough to compensate for the small contamination components for each coil. Accordingly, to provide such accuracy, the calibrations are often time consuming and inefficient (e.g., up to 5 hours for an expert for a system to have all the linear and second order shims). Further, because some ultra-high field scanners are equipped with higher order (e.g., 3-rd or 4-th) shim coils, the amount of time to calibrate these shims may cause the calibrations to become impractical.

Embodiments of the present invention include systems and methods of providing automatic shim calibration to improve shim quality. Embodiments of the present invention use repeat shim runs performed by the users during routine studies.

FIG. 1 is a system block diagram illustrating a system 10 for automated magnetic field shimming in MR imaging. As shown at FIG. 1, system 10 includes a magnet 12 configured to create a static magnetic field in the body of patient 11 to be imaged and positioned on a table. System 10 also includes a plurality of coils 14 that include gradient coils and shimming coils configured to produce position dependent magnetic field gradients superimposed on the static magnetic field. The gradient coils are configured to generate linear slice select magnetic field gradients on a static magnetic field. The coils 14, in response to gradient signals supplied thereto by a gradient and shimming and pulse sequence control module 16, produce position dependent and shimmed magnetic field gradients in three orthogonal directions and generate magnetic field pulse sequences. The shimming coils are configured to generate non-linear magnetic field gradients on the static magnetic field to modify the homogeneity of the static magnetic field. That is, the shimmed gradients compensate for non-homogeneity and variability in an MR imaging device magnetic field resulting from patient anatomical variation and other sources. The magnetic field gradients include a slice-selection gradient magnetic field, a phase encoding gradient magnetic field and a readout gradient magnetic field that are applied to patient 11.

Further, Radio Frequency (RF) module 20 provides RF pulse signals to RF coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16, in conjunction with RF module 20 as directed by central control unit 26, control slice-selection, phase encoding, readout gradient magnetic fields, radio frequency transmission, and magnetic resonance signal detection to acquire magnetic resonance signals representing planar slices of patient 11.

In response to applied RF pulse signals, the RF coils 18 receive MR signals. For example, RF coils 18 may receive signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. In some embodiments, the image data processor (e.g., image data processor 27) may be external to the central control unit 26. ECG synchronization signal generator 30 provides ECG signals used for pulse sequence and imaging synchronization. A two or three dimensional k-space storage array of individual data elements in unit 34 stores corresponding individual frequency components comprising a MR dataset.

A RF signal generator comprising module 20 and RF coils 18 generates RF excitation pulses in anatomy of patient 11 and enables subsequent acquisition of associated RF echo data. A magnetic field gradient generator (comprising magnetic coils 12 and 14) generates a magnetic field for use in acquiring multiple individual frequency components and generates magnetic field gradients for anatomical slice selection, phase encoding and readout RF data acquisition in a three dimensional (3D) anatomical volume. The RF signal generator units 18 and 20 and the magnetic field gradient generator units 12 and 14 provide a rotating frame preparation pulse sequence comprising at least one of: (a) a T1 spin lattice relaxation in a rotating frame (T1ρ) preparation pulse sequence of adiabatic pulses comprising modulated RF pulses and modulated magnetic field gradients for slice selection; and (b) a T2 spin-spin relaxation in a rotating frame (T2ρ) preparation pulse sequence of adiabatic pulses comprising modulated RF pulses and modulated magnetic field gradients for slice selection.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data, as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2:
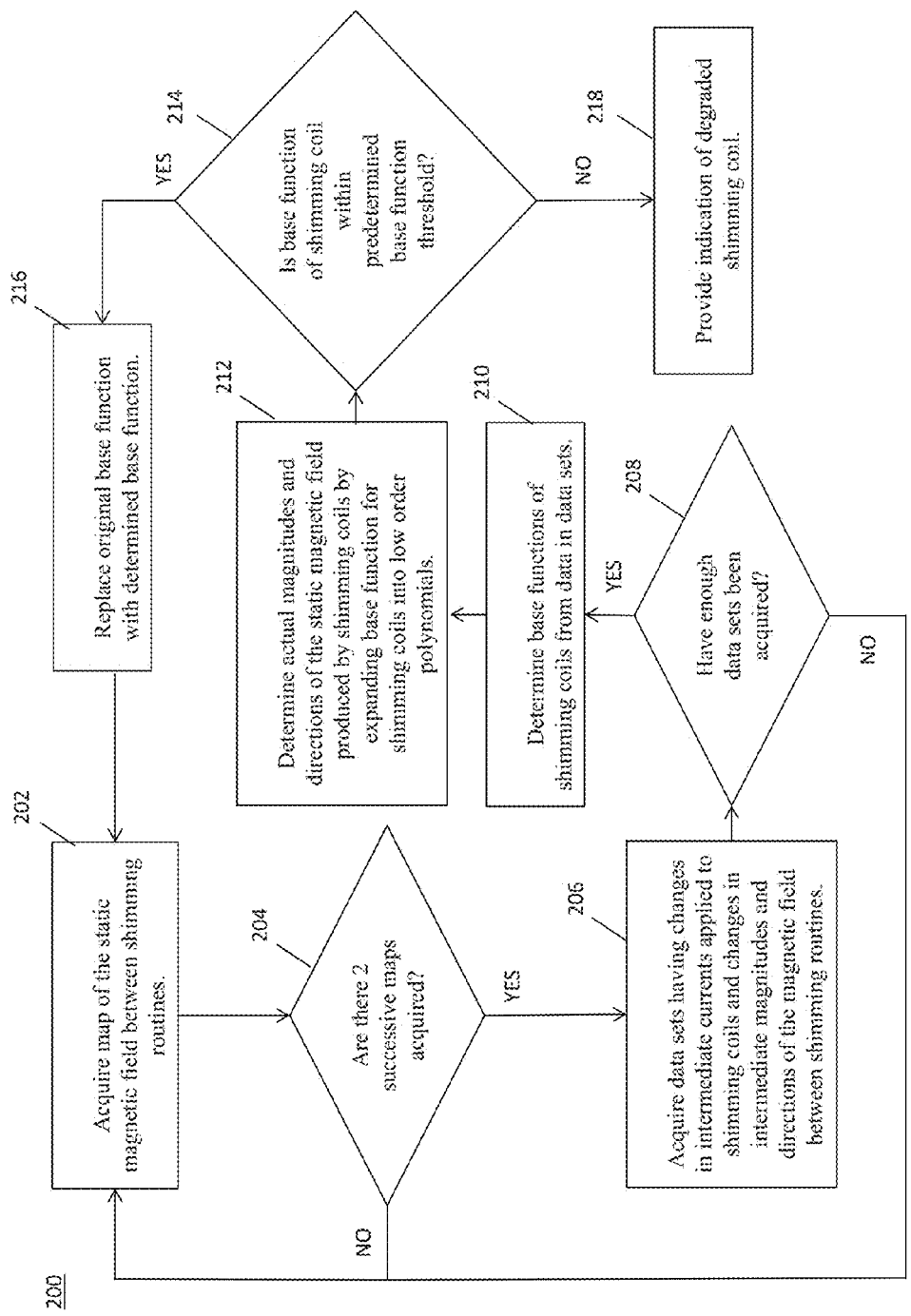
FIG. 2 is a flow diagram illustrating a method for automated magnetic field shimming in a MR imaging system for use with embodiments disclosed herein.

FIG. 2 is a flow diagram illustrating an exemplary method 200 for automated magnetic field shimming in a MR imaging system. As shown at step 202 in FIG. 2, the method 200 may include acquiring a $B_0$ map of the static magnetic field between shimming routines. During MR imaging, multiple shimming routines are performed by applying shim currents from the shimming coils. The RF coils may repeatedly acquire $B_0$ maps of the static magnetic field between the shimming routines. The $B_0$ maps, shim data and the applied currents may be collected and recorded to derive optimized scanner specific base functions to calculate the shimming currents applied by each shimming coil.

During MR imaging, the number of shimming routines performed for a given volume of anatomy may be varied and may depend on an operator selection. Accordingly, different numbers of $B_0$ maps may be obtained between the multiple shimming routines, depending on the number of shimming routines performed. At decision point 204 in FIG. 2, the method 200 may include determining whether two successive $B_0$ maps are acquired. If two successive $B_0$ maps are not acquired, the method proceeds back to step 202 in FIG. 2 and another $B_0$ map of the static magnetic field may be acquired between the previous shimming routine and the next shimming routine.

When two successive $B_0$ maps are acquired, the method proceeds to step 206 in FIG. 2 and data sets may be acquired and stored. The acquired data sets include changes in intermediate currents applied to shimming coils between shimming routines and changes in intermediate magnitudes and directions of the magnetic field between shimming routines. The amount of current applied by a shimming coil at the end (end current $a_{i,j}$) of a shimming routine (j) and the beginning (initial current $a_{i,j+1}$) of the next shimming routine (0+1j) may be identified. Accordingly, the intermediate current change ($\Delta a_{i,j}$) applied to shimming coils between shimming routines (j) may be determined, for example, as shown below in equation (3):

$$\Delta a_{i,j} = a_{i,j+1} - a_{i,j} \quad (3)$$

The corresponding $B_0$ maps for the j-th and 0+1j-th call of the shimming sequence may also be identified. Accordingly, the intermediate magnitude and direction change ($\Delta B_0$) of the three dimensional (x,y,z) magnetic field $B_0$ produced by each shimming coil between shimming routines (j) may be determined, for example, as shown below in equation (4):

$$\Delta B_{0,j}(x,y,z) = B_{0,j+1}(x,y,z) - B_{0,j}(x,y,z) \quad (4)$$

At decision point 208 in FIG. 2, the method 200 may include determining whether enough data sets have been acquired. If the shim routine has been called p times, p-1 data sets may be acquired and stored to a data base to provide an accurate base function ($F_i$) for each shimming coil after enough data sets are accumulated. For example, a controller, such as central control unit 26, may determine that enough data sets have been acquired when a number of shimming routines has been performed to cause the static magnetic field $B_0$ to be within a homogeneous magnetic field threshold. If central control unit 26 determines that enough data sets have not been acquired (e.g., that the number of shimming routines performed has not caused the static magnetic field $B_0$ to be within a homogeneous magnetic field threshold), the method proceeds back to step 202 in FIG. 2 and another $B_0$ map of the static magnetic field may be acquired between the previous shimming routine and the next shimming routine.

When central control unit 26 determines that enough data sets have been acquired, the method proceeds to steps 210 and 212 in FIG. 2. In step 210, the control processor may determine a base function $F_i$ for each of the shimming coils. From the intermediate current changes ($\Delta a_{i,j}$) and the determined intermediate magnitude and direction changes ($\Delta B_{0,j}(x,y,z)$) for each shimming coil, base functions F, for each shimming coil may be determined, for example, as shown below in equation (5):

$$\Delta B_{0,j}(x,y,z) = \Sigma_{i=1}^{N} \Delta a_{i,j} F_i(x,y,z) \quad (5)$$

In step 210, the control processor may determine the updated magnitudes and directions of the static magnetic field produced by each of the plurality of shimming coils by expanding the determined base function for each of the plurality of shimming coils into low order polynomials. In some aspects, the determination of the updated magnitudes may be an approximation of the updated magnitudes within a predetermined approximation threshold. While $F_i$ may be derived from Equation (5) if enough changed shim currents $\Delta a_i$ and intermediate magnitude and direction changes ($\Delta B_0$) are acquired, the base function F, determined using Equation (5) may be better expressed by expanding the base function $F_i$ for each of the plurality of shimming coils into low order polynomials, such as Legendre polynomials ($L_k$) to a degree (K). In some aspects, the degree K of the polynomials may be in the range from about 6 degrees to about 10 degrees. Embodiments may, however, include lower order polynomials having other degrees. The base function Fi determined using Equation (5) may, for example, be expanded into low order polynomials, as shown below in Equation (6):

$$\Delta B_{0,j}(x,y,z) = \Sigma_{i=1}^{N} \Delta a_{i,j} F_i(x,y,z) = \Sigma_{i=1}^{N} \Delta a_i \Sigma_{k=1}^{K} c_{ik} L_k \quad (6)$$

Accordingly, when enough data sets have been acquired, a least square fit routine may be performed using Equation (5) and Equation (6) to determine the coefficients of the Legendre polynomials for the MR imaging system to determine (e.g., approximate within a predetermined approximation threshold) the updated base function and therefore, determine the updated magnitudes and directions of the static magnetic field produced by each of the plurality of shimming coils.

At decision point 214 in FIG. 2, the method 200 may include determining whether the base function $F_i$ of each shimming coil is within a predetermined base function threshold. If the base function $F_i$ of particular shimming coil is not within a predetermined base function threshold, the method proceeds to step 218 in FIG. 2 and an indication may be provided that the shimming coil is degraded and service is needed.

When the base function $F_i$ of each shimming coil is determined to be equal to or within a predetermined base function threshold, the method proceeds to step 216 and the original base function (e.g., base function from factory) for a particular shimming coil may be replaced with the newly determined base function. Accordingly, any future shimming routines may use the new base function instead of the original base function for shimming.

Figure 3:
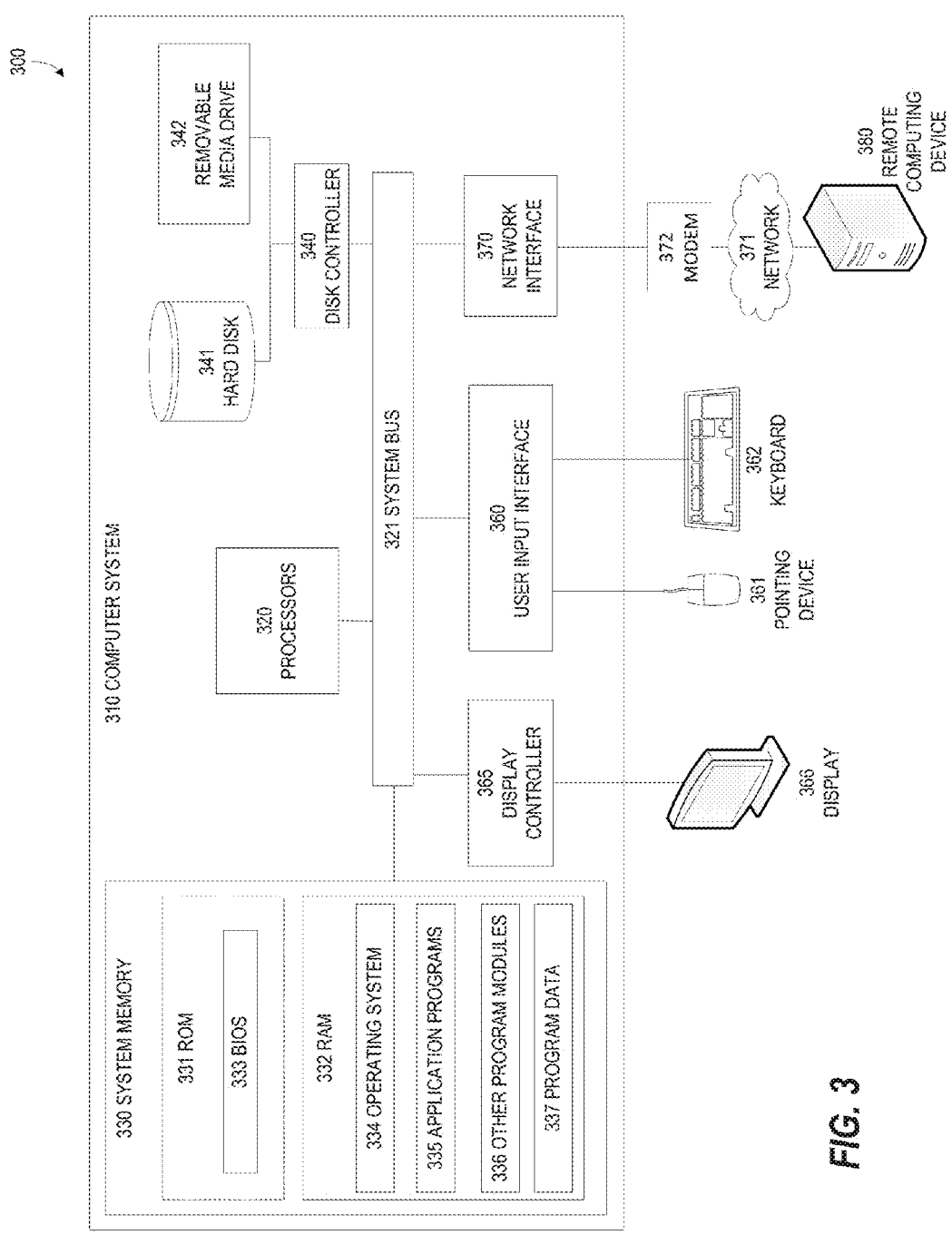
FIG. 3 illustrates an example of a computing environment within which embodiments of the invention may be implemented.

FIG. 3 illustrates an example of a computing environment 300 within which embodiments of the invention may be implemented. Computing environment 300 may include computer system 310, which is one example of a computing system upon which embodiments of the invention may be implemented. As shown in FIG. 3, the computer system 310 may include a communication mechanism such as a bus 321 or other communication mechanism for communicating information within the computer system 310. The system 310 further includes one or more processors 320 coupled with the bus 321 for processing the information. The processors 320 may include one or more CPUs, GPUs, or any other processor known in the art.

The computer system 310 also includes a system memory 330 coupled to the bus 321 for storing information and instructions to be executed by processors 320. The system memory 330 may include computer readable storage media in the form of volatile and/or nonvolatile memory, such as read only memory (ROM) 331 and/or random access memory (RAM) 332. The system memory RAM 332 may include other dynamic storage device(s) (e.g., dynamic RAM, static RAM, and synchronous DRAM). The system memory ROM 331 may include other static storage device(s) (e.g., programmable ROM, erasable PROM, and electrically erasable PROM). In addition, the system memory 330 may be used for storing temporary variables or other intermediate information during the execution of instructions by the processors 320. A basic input/output system 333 (BIOS) containing the basic routines that help to transfer information between elements within computer system 310, such as during start-up, may be stored in ROM 331. RAM 332 may contain data and/or program modules that are immediately accessible to and/or presently being operated on by the processors 320. System memory 330 may additionally include, for example, operating system 334, application programs 335, other program modules 336 and program data 337.

The computer system 310 also includes a disk controller 340 coupled to the bus 321 to control one or more storage devices for storing information and instructions, such as a magnetic hard disk 341 and a removable media drive 342 (e.g., floppy disk drive, compact disc drive, tape drive, and/or solid state drive). The storage devices may be added to the computer system 310 using an appropriate device interface (e.g., a small computer system interface (SCSI), integrated device electronics (IDE), Universal Serial Bus (USB), or FireWire).

The computer system 310 may also include a display controller 365 coupled to the bus 321 to control a display or monitor 366, such as a cathode ray tube (CRT) or liquid crystal display (LCD), for displaying information to a computer user. The computer system includes an input interface 360 and one or more input devices, such as a keyboard 362 and a pointing device 361, for interacting with a computer user and providing information to the processor 320. The pointing device 361, for example, may be a mouse, a trackball, or a pointing stick for communicating direction information and command selections to the processor 320 and for controlling cursor movement on the display 366. The display 366 may provide a touch screen interface which allows input to supplement or replace the communication of direction information and command selections by the pointing device 361.

The computer system 310 may perform a portion or all of the processing steps of embodiments of the invention in response to the processors 320 executing one or more sequences of one or more instructions contained in a memory, such as the system memory 330. Such instructions may be read into the system memory 330 from another computer readable medium, such as a hard disk 341 or a removable media drive 342. The hard disk 341 may contain one or more datastores and data files used by embodiments of the present invention. Datastore contents and data files may be encrypted to improve security. The processors 320 may also be employed in a multi-processing arrangement to execute the one or more sequences of instructions contained in system memory 330. In alternative embodiments, hard-wired circuitry may be used in place of or in combination with software instructions. Thus, embodiments are not limited to any specific combination of hardware circuitry and software.

As stated above, the computer system 310 may include at least one computer readable medium or memory for holding instructions programmed according to embodiments of the invention and for containing data structures, tables, records, or other data described herein. The term "computer readable medium" as used herein refers to any non-transitory, tangible medium that participates in providing instructions to the processor 320 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 341 or removable media drive 342. Non-limiting examples of volatile media include dynamic memory, such as system memory 330. Non-limiting examples of transmission media include coaxial cables, copper wire, and fiber optics, including the wires that make up the bus 321. Transmission media may also take the form of acoustic or light waves, such as those generated during radio wave and infrared data communications.

The computing environment 300 may further include the computer system 310 operating in a networked environment using logical connections to one or more remote computers, such as remote computer 380. Remote computer 380 may be a personal computer (laptop or desktop), a mobile device, a server, a router, a network PC, a peer device or other common network node, and typically includes many or all of the elements described above relative to computer 310. When used in a networking environment, computer 310 may include modem 372 for establishing communications over a network 371, such as the Internet. Modem 372 may be connected to system bus 321 via user network interface 370, or via another appropriate mechanism.

Network 371 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 310 and other computers (e.g., remote computing system 380). The network 371 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 371.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The GUI also includes an executable procedure or executable application. The executable procedure or executable application conditions the display processor to generate signals representing the GUI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the GUI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of the figures presented herein are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIG. 3. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

Although the invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

The invention claimed is:

1. A method for automated magnetic field shimming in a Magnetic Resonance (MR) imaging system, the method comprising:
   generating radio frequency (RF) excitation pulses in a volume of patient anatomy comprising a patient's heart to provide subsequent acquisition of associated RF echo data;
   generating slice select magnetic field gradients on a static magnetic field for phase encoding and readout RF data acquisition in the volume of patient anatomy;
   generating a plurality of shimming routines, each shimming routine comprising applying non-linear magnetic field gradients to the static magnetic field to modify the homogeneity of the static magnetic field;
   acquiring a plurality of maps of the static magnetic field, each of the plurality of maps being acquired between each shimming routine;
   determining, by a control processor, a base function for each of the plurality of shimming coils from: (i) intermediate magnitudes and directions of the static magnetic field produced by each of the plurality of shimming coils during each shimming routine; and (ii) intermediate currents supplied to each of the plurality of shimming coils during each shimming routine; and
   determining, by the control processor, updated magnitudes and directions of the static magnetic field produced by each of the plurality of shimming coils by expanding the determined base function for each of the plurality of shimming coils into low order polynomials.

2. The method according to claim 1, further comprising determining the base function for each of the plurality of shimming coils by using data from a plurality of data sets, each data set provided by a corresponding shimming routine and comprising: (i) a change in the intermediate currents supplied to each of the plurality of shimming coils between each shimming routine; and (ii) a change in the intermediate magnitudes and directions of the static magnetic field between each shimming routine.

3. The method according to claim 2, further comprising storing: (i) the change in current supplied to each of the plurality of shimming coils between each shimming routine; and (ii) the change in the magnitude and direction of the static magnetic field between each shimming routine.

4. The method according to claim 2, further comprising using the data from the plurality of data sets to determine the updated magnitudes and directions of the static magnetic field produced by each of the plurality of shimming coils when a number of shimming routines has been performed to cause the static magnetic field to be within a homogeneous threshold.

5. The method according to claim 1, wherein the degree of the low order polynomials is in the range from about 6 degrees to about 10 degrees.

6. The method according to claim 1, further comprising determining the updated magnitudes and directions of the static magnetic field produced by each of the plurality of shimming coils by expanding the base function for each of the plurality of shimming coils into low order Legendre polynomials.

7. The method according to claim 1, further comprising replacing an original base function for one or more of the plurality of shimming coils with the determined base function for the one or more of the plurality of shimming coils when the determined base function is equal to or within a predetermined base function threshold of the original base function.

8. The method according to claim 1, further comprising providing an indication that one or more of the plurality of shimming coils is degraded when the determined base function is not within a predetermined base function threshold of the original base function.

9. A multi-slice, multi-segment magnetic resonance (MR) imaging system, comprising:
   a radio frequency (RF) signal generator configured to generate RF excitation pulses in patient anatomy and enabling subsequent acquisition of associated RF echo data;
   a magnetic field gradient generator comprising: (i) a plurality of gradient coils configured to generate linear slice select magnetic field gradients on a static magnetic field; and (ii) a plurality of shimming coils configured to generate a plurality of shimming routines, each shimming routine comprising applying non-linear magnetic field gradients to the static magnetic field to modify the homogeneity of the static magnetic field;
   a plurality of RF coils configured to acquire a plurality of maps of the static magnetic field, each of the plurality of maps being acquired between each shimming routine; and
   a controller configured to determine: (i) a base function for each of the plurality of shimming coils from intermediate magnitudes and directions of the static magnetic field produced by each of the plurality of shimming coils during each shimming routine and intermediate currents supplied to each of the plurality of shimming coils during each shimming routine; and (ii) updated magnitudes and directions of the static magnetic field produced by each of the plurality of shimming coils by expanding the determined base function for each of the plurality of shimming coils into low order polynomials.

10. The system according to claim 9, wherein the controller is further configured to determine the base function for each of the plurality of shimming coils by using data from a plurality of data sets, each data set provided by a corresponding shimming routine and comprising: (i) a change in current supplied to each of the plurality of shimming coils between each shimming routine; and (ii) a change in the magnitude and direction of the static magnetic field between each shimming routine.

11. The system according to claim 10, wherein the controller is further configured to store: (i) the change in current supplied to each of the plurality of shimming coils between each shimming routine; and (ii) the change in the magnitude and direction of the static magnetic field between each shimming routine.

12. The system according to claim 10, wherein the controller is further configured to use the data from the plurality of data sets to determine the updated magnitudes and directions of the static magnetic field produced by each of the plurality of shimming coils when a number of shimming routines has been performed to cause the static magnetic field to be within a homogeneous threshold.

13. The system according to claim 9, wherein the degree of the low order polynomials is in the range from about 6 degrees to about 10 degrees.

14. The system according to claim 9, wherein the controller is further configured to determine the updated magnitudes and directions of the static magnetic field produced by each of the plurality of shimming coils by expanding the base function for each of the plurality of shimming coils into low order Legendre polynomials.

15. The system according to claim 9, wherein the controller is further configured to replace an original base function for one or more of the plurality of shimming coils with the determined base function for the one or more of the plurality of shimming coils when the determined base function is equal to or within a predetermined base function threshold of the original base function.

16. The system according to claim 9, wherein the controller is further configured to provide an indication that one or more of the plurality of shimming coils is degraded when the determined base function is not within a predetermined base function threshold of the original base function.

17. An article of manufacture for operating a multi-slice, multi-segment magnetic resonance (MR) imaging system, the article of manufacture comprising a non-transitory, tangible computer-readable medium holding computer-executable instructions for performing a method comprising:
   generating radio frequency (RF) excitation pulses in a volume of patient anatomy comprising a patient's heart to provide subsequent acquisition of associated RF echo data;
   generating slice select magnetic field gradients on a static magnetic field for phase encoding and readout RF data acquisition in the volume of patient anatomy;
   generating a plurality of shimming routines, each shimming routine comprising applying non-linear magnetic field gradients to the static magnetic field to modify the homogeneity of the static magnetic field;
   acquiring a plurality of maps of the static magnetic field, each of the plurality of maps being acquired between each shimming routine
   determining a base function for each of the plurality of shimming coils from: (i) intermediate magnitudes and directions of the static magnetic field produced by each of the plurality of shimming coils during each shimming routine; and (ii) intermediate currents supplied to each of the plurality of shimming coils during each shimming routine; and
   determining updated magnitudes and directions of the static magnetic field produced by each of the plurality of shimming coils by expanding the determined base function for each of the plurality of shimming coils into low order polynomials.

18. The article of manufacture of claim 17, wherein the medium holds computer-executable instructions for further performing determining the base function for each of the plurality of shimming coils by using data from a plurality of data sets, each data set provided by a corresponding shimming routine and comprising: (i) a change in current supplied to each of the plurality of shimming coils between each shimming routine; and (ii) a change in the magnitude and direction of the static magnetic field between each shimming routine.

19. The article of manufacture of claim 18, wherein the medium holds computer-executable instructions for further performing using the data from the plurality of data sets to determine the updated magnitudes and directions of the static magnetic field produced by each of the plurality of shimming coils when a number of shimming routines has been performed to cause the static magnetic field to be within a homogeneous threshold.

20. The article of manufacture of claim 18, wherein the medium holds computer-executable instructions for further performing replacing an original base function for one or more of the plurality of shimming coils with the determined base function for the one or more of the plurality of shimming coils when the determined base function is equal to or within a predetermined base function threshold of the original base function.

* * * * *